United States Patent
Sundararajan et al.

(10) Patent No.: US 6,214,526 B1
(45) Date of Patent: *Apr. 10, 2001

(54) SEMICONDUCTOR PROCESSING USING ANTIREFLECTIVE LAYER HAVING HIGH WET ETCH RATE

(75) Inventors: Srinivasan Sundararajan, Sunnyvale; Kenneth P. MacWilliams, Los Gatos; David Mordo, San Jose, all of CA (US)

(73) Assignee: Novellus Systems, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/024,929

(22) Filed: Feb. 17, 1998

(51) Int. Cl.⁷ .................................................... G03F 7/00
(52) U.S. Cl. .......................... 430/316; 430/313; 430/317; 427/579; 427/99
(58) Field of Search ..................... 430/313, 314, 430/316, 317; 427/569, 578, 579, 585, 99

(56) References Cited

U.S. PATENT DOCUMENTS

| | | | |
|---|---|---|---|
| 5,264,072 | * 11/1993 | Mukai | 156/620.7 |
| 5,284,789 | * 2/1994 | Mori et al. | 437/113 |
| 5,633,191 | * 5/1997 | Chao | 438/448 |
| 5,831,321 | * 11/1998 | Nagayama | 257/412 |
| 5,854,136 | * 12/1998 | Huang et al. | 438/714 |
| 5,858,819 | * 1/1999 | Miyasaka | 438/149 |
| 5,858,870 | * 1/1999 | Zheng et al. | 438/622 |

FOREIGN PATENT DOCUMENTS 5-129286 * 5/1993 (JP) .

OTHER PUBLICATIONS

T.P. Ong et al, "CVD $SiN_x$ Anti–reflective Coating for Sub–0.5 μm Lithography", 1995 Symposium on VLSI Technology Digest of Technical Papers, pp. 73–74.

R. DeJule, "Resist Enhancement with Antireflective Coatings", Jul. 1996, Semiconductor International, pp. 169–175.

* cited by examiner

Primary Examiner—Kathleen Duda
(74) Attorney, Agent, or Firm—Skjerven Morril MacPherson LLP; David E. Steuber

(57) ABSTRACT

An antireflective layer for use in semiconductor photolithography is fabricated of silicon nitride ($Si_{1-x-y}N_xH_y$) in a plasma-enhanced chemical vapor deposition process using a gaseous mixture of ammonia, silane and nitrogen. By varying the process temperature and the ratio of ammonia to silane, acceptable values of the refractive index n and extinction coefficient k can be obtained. The silicon nitride layer produced by this technique etches rapidly and therefore allows the antireflective layer to be removed quickly, thereby minimizing the damage to the underlying structures in a semiconductor device.

12 Claims, 4 Drawing Sheets

| | Etch rate | n,k | Uniformity |
|---|---|---|---|
| Deposition Temperature ↓ | ↑↑ | ↓↓ | ↑ |
| SiH$_4$ flow ↑ | ↓ | ↑ | ↓ (improves) |
| NH$_3$/SiH$_4$ ratio ↓ | ↓ | ↑↑ | ↑ |
| N$_2$ flow ↓ | <–> | ↑ | <–> |
| RF power ↓ | <–> | ↑ | <–> |

| NH3/SiH4 Ratio | Total Flow (sccm) | SDT* (sec) | SiH4 (sccm) | NH3 (sccm) | N2 (sccm) | t@365 nm | n@365 nm | k@365 nm | t unif (%) | n unif (%) | k unif (%) |
|---|---|---|---|---|---|---|---|---|---|---|---|
| 3:1 | 5600 | 4.17 | 412 | 1211 | 3976 | 271 | 2.4095 | 0.2225 | 2.231 | 1.262 | 5.751 |
| 2.2:1 | 5500 | 3.33 | 546 | 1213 | 3740 | 246 | 2.6169 | 0.3855 | 2.446 | 0.627 | 2.185 |
| 2.6:1 | 6200 | 4.17 | 597 | 1572 | 4030 | 283 | 2.5498 | 0.3356 | 1.698 | 0.398 | 2.798 |
| 2.2:1 | 5500 | 3.33 | 546 | 1213 | 3740 | 247 | 2.622 | 0.3819 | 2.421 | 0.497 | 1.995 |
| 1.9:1 | 5200 | 2.50 | 583 | 1080 | 3536 | 205 | 2.6987 | 0.4571 | 2.38 | 0.619 | 3.425 |
| 1.9:1 | 5800 | 3.33 | 589 | 1092 | 4118 | 256 | 2.6956 | 0.4426 | 2.319 | 0.508 | 2.238 |
| 2.4:1 | 6200 | 2.50 | 586 | 1397 | 4216 | 185 | 2.5265 | 0.3433 | 2.125 | 0.551 | 4.247 |
| 3:1 | 5600 | 2.50 | 497 | 1462 | 3640 | 179 | 2.4397 | 0.2729 | 2.353 | 1.228 | 8.64 |
| 1.9:1 | 5000 | 4.17 | 508 | 941 | 3550 | 333 | 2.6531 | 0.4817 | 3.693 | 1.996 | 5.172 |
| 3:1 | 6400 | 4.17 | 519 | 1528 | 4352 | 265 | 2.4377 | 0.2543 | 1.724 | 0.35 | 2.706 |
| 1.9:1 | 5000 | 2.50 | 508 | 941 | 3550 | 202 | 2.6445 | 0.4301 | 1.514 | 0.375 | 3.634 |
| 3:1 | 5000 | 4.17 | 561 | 1038 | 3400 | 336 | 2.6811 | 0.5361 | 5.602 | 3.047 | 5.956 |
| 2:1 | 5000 | 4.17 | 405 | 1194 | 3400 | 277 | 2.4564 | 0.2521 | 1.603 | 0.546 | 3.93 |
| 2:1 | 5000 | 4.17 | 583 | 1166 | 3250 | 328 | 2.6851 | 0.4988 | 4.64 | 1.973 | 4.217 |
| 3:1 | 6200 | 4.17 | 599 | 1198 | 4402 | 311 | 2.6124 | 0.4392 | 3.029 | 1.311 | 3.788 |
| 3:1 | 5000 | 2.50 | 405 | 1194 | 3400 | 177 | 2.3895 | 0.2437 | 1.639 | 0.803 | 8.383 |
| 3:1 | 5000 | 2.50 | 367 | 1082 | 3550 | 177 | 2.3703 | 0.2214 | 1.839 | 1.065 | 11.189 |
| 3:1 | 5000 | 3.33 | 367 | 1082 | 3550 | 225 | 2.3793 | 0.2373 | 1.167 | 0.458 | 3.811 |
| 3:1 | 6400 | 2.50 | 470 | 1385 | 4544 | 171 | 2.3627 | 0.2316 | 1.698 | 0.465 | 3.727 |
| 3:1 | 6400 | 2.50 | 470 | 1385 | 4544 | 266 | 2.4164 | 0.2294 | 1.351 | 0.42 | 1.986 |
| 3:1 | 6400 | 4.17 | 568 | 1671 | 4160 | 175 | 2.4261 | 0.2651 | 2.19 | 1.41 | 8.998 |
| 3:1 | 5000 | 4.17 | 444 | 1305 | 3250 | 281 | 2.4845 | 0.2801 | 1.309 | 0.582 | 3.397 |
| 2:1 | 5000 | 2.50 | 583 | 1166 | 3250 | 201 | 2.6749 | 0.4402 | 1.942 | 0.643 | 2.941 |

* Station deposition time

FIG. 7

SEMICONDUCTOR PROCESSING USING ANTIREFLECTIVE LAYER HAVING HIGH WET ETCH RATE

BACKGROUND OF THE INVENTION

As the dimensions of semiconductor devices have become smaller, the wavelength of the radiation that is used to expose the photoresist has also become smaller. The short-wavelength radiation is required for the resolution that is necessary to define the extremely minute features of these devices. "I-line" radiation with a wavelength ($\lambda$) of 365 nm and deep ultraviolet (DUV) radiation with a wavelength of 248 nm are now in use and the introduction of radiation having a wavelength of 193 nm is foreseeable.

The use of short-wavelength radiation has the effect of increasing the reflectivity of the radiation at the interface between the photoresist layer and the underlying material, and this has led to thin film interference (TFI) effects, such as standing waves which produce variations in the dimensions of the features of the device and the exposure of normally unexposed areas from non-normal reflections (sometimes called "reflective notching").

To overcome these problems, semiconductor device manufacturers have turned to the formation of antireflective layers (ARLs) underneath the photoresist. By means of negative interference and absorption, ARLs substantially reduce the amount of radiation that is reflected back into the photoresist layer where it can create the problems referred to above. See generally, De Jule, "Resist Enhancement With Antireflective Coating", Semiconductor International, July 1996, p. 169 et seq.

A layer of silicon oxynitride (SiON) having a thickness in the range of 50 Å to 1 micron has been widely used as an ARL. While SiON has good functional qualities, a problem with SiON is that it can be etched only at a relatively slow rate. In many situations the ARL must be removed after the underlying layer has been patterned. Typically, the process sequence would be as follows. First, after the ARL and photoresist layer have been deposited, the photoresist layer is patterned. Second, the ARL exposed by the patterning of the photoresist is etched. Third, the underlying layer is patterned, using the photoresist as a mask. Fourth, the photoresist layer is removed. Fifth, the ARL is etched.

Silicon nitride ($SiN_x$) has also been suggested for use as an ARL, in T. P. Ong et al., "CVD $SiN_x$ Anti-reflective Coating for Sub-0.5 $\mu$m Lithography", 1996 Symposium on VLSI Technology Digest of Technical Papers, p 73 et seq.

In etching the ARL it is important to minimize the damage to the underlying, patterned layer. The slow etch rate of SiON creates problems in this regard. For example, FIG. 1 shows a layer 10 of borophosphosilicate glass (BPSG) which has been patterned to form an aperture 14 for a contact. The difficulty of etching the ARL 12 has created an overhang of the BPSG layer 10 on either side of the aperture. Certain applications in logic, memory and flash technologies also require that the ARL be removed without doing damage to the underlying structure. FIG. 2 shows a typical floating gate memory transistor 20, including a gate oxide layer 21, a floating polysilicon gate 22, an oxide-nitride-oxide (ONO) layer 23, a control gate 24, an overlying oxide layer 25, and an ARL 26. In such devices, it is important that the gate oxide layer 21, the ONO layer 23 and the oxide layer 25 remain unperturbed after the ARL 26 has been removed. Furthermore, in the fin-type capacitors used in certain DRAM designs, it is desirable to leave the oxide or ONO layer undamaged after the ARL has been etched.

Each device can be considered as having an "etch budget", which is the amount of time during which the exposed structures can be subjected to etchant without undue damage. In many cases the removal of the silicon oxynitride and silicon nitride ARLs that have been developed until now exceeds this etch budget. Thus, a need exists for an ARL which can be removed relatively fast and without exceeding the etch budget.

SUMMARY OF THE INVENTION

In accordance with this invention, an ARL is formed of silicon nitride ($Si_{1-(x+y)}N_xH_y$). The ARL is formed in a plasma-enhanced chemical vapor deposition (PECVD) unit under process conditions that are designed to provide an ARL having the desired properties. These properties principally include thickness, refractive index (n), extinction coefficient (k), and etch rate. The values of n and k are a function of the wavelength of the radiation and the etch rate is a function of the etchant used.

The silicon nitride layer is formed by introducing gaseous ammonia ($NH_3$) and silane ($SiH_4$) into the reaction chamber of the PECVD unit in the presence of nitrogen ($N_2$). The process conditions or parameters of this invention are principally the temperature of the reactant gases, the volumetric ratio of $NH_3$ to $SiH_4$, and the rate at which radio frequency (RF) power is applied in the PECVD unit (per unit area of the surface of the wafer or other substrate on which the ARL is formed). The temperature should be in the range of 1500° C. to 4500° C.; the ratio of $NH_3$ to $SiH_4$ should be in the range of 1:1 to 6:1 or 7:1; and the RF power level should be in the range of from 0.02 W/cm$^2$ to 1.0 W/cm$^2$, preferably about 0.12 W/cm$^2$. If the temperature is greater than 390° C., the ratio of $NH_3$ to $SiH_4$ should be in the range of 1:1 to 6:1. For deep ultraviolet (DUV) radiation ($\lambda$=248 nm), the temperature is preferably about 250° C. and the ratio of $NH_3$ to $SiH_4$ is preferably about 6:1. For i-line radiation ($\lambda$=365 nm), the temperature is preferably about 400° C., and the ratio of $NH_3$ to $SiH_4$ is preferably about 3:1. For radiation at a wavelength of 193 nm, the temperature is preferably about 200° C., and the ratio of $NH_3$ to $SiH_4$ is preferably about 6:1.

Generally, lowering the temperature increases the etch rate and reduces the values of n and k, and lowering the ratio of $NH_3$ to $SiH_4$ reduces the etch rate and increases the values of n and k. Thus the selection of the actual process parameters involves a compromise of the desired properties of the ARL.

The process parameters used in accordance with this invention are clearly distinguishable from those used in the prior art to form silicon nitride layers, whether those layers are used as ARLs or as passivation layers in semiconductor devices or for other purposes. Silicon nitride layers are conventionally formed at a temperature of about 400° C. and with a ratio of $NH_3$ to $SiH_4$ of about 8:1. Ong et al., supra, for example, suggest using a low-pressure chemical vapor deposition (LPCVD) unit or "conventional large batch diffusion furnace". Silicon nitride layers formed under such conditions do not exhibit the fast etch rate of the silicon nitride layers of this invention.

The silicon nitride ARL is typically 1 micron or less in thickness. The silicon nitride is distinguished in that in the formula $Si_{1-(x+y)}N_xH_y$ x is in the range 0.65–0.75 or y is in the range 0.25–0.50 and frequently in the range 0.30–0.50. While this level of hydrogen would normally create reliability problems in a transistor, these problems are not a factor in this situation because the ARL is removed. In other embodiments x may be in the range 0.20–0.50 or y may be in range 0.03–0.17. The particular percentage levels of the Si, N and H in the silicon nitride ARL will depend on the etchant used.

The etch rate of an ARL of this invention is determined by the process parameters and etchant and typically varies from 3000 Å/min to 20000 Å/min. By comparison, the etch rate of thermal $SiO_2$ in a 10:1 buffered oxide etchant HF (BOE-HF) is approximately 660 Å/min. The preferred etchant for the DUV ARL is BOE-HF and the preferred etchant for the i-line ARL is hot phosphoric acid.

BRIEF DESCRIPTION OF THE DRAWINGS

FIG. 7 is a table which shows values of i-line ARL n and k at various flow rates and $SiH_4$ to $NH_3$ ratios at 400° C.

DESCRIPTION OF THE INVENTION

A series of experiments were performed to determine the relationship between the values of n and k and the wet etch rate and the various process parameters (principally the temperature and $NH_3:SiH_4$ ratio) for both deep ultraviolet (DUV) and i-line silicon nitride ARLs. The DUV ARL is for use with radiation having a wavelength of 248 nm, and the i-line ARL is for use with radiation having a wavelength of 365 nm. The experiments were performed in a CONCEPT TWO SEQUEL plasma-enhanced chemical vapor deposition (PECVD) unit, available from Novellus Systems, Inc., of San Jose, Calif. The SEQUEL unit is a sequential multistation PECVD tool. The silicon nitride ARLs were deposited using $NH_3$, $SiH_4$ and $N_2$.

DUV ARLs

For a DUV ARL a refractive index n=2.1 @λ=248 nm and an absorptive coefficient k=0.5 @λ=248 nm and a thickness of 300 Å are normally required for a polysilicon gate structure.

The ratio of $NH_3$ to $SiH_4$ was varied from 8:1 to 3.5:1, while keeping the temperature constant at 250° C. and the total gas flow constant at 6000 sccm. The value of n varied from 2.1 to 2.3 and the value of k varied from 0.3 to 0.6. Both n and k showed a monotonic decrease with increases in the $NH_3$ to $SiH_4$ ratio. As the $NH_3:SiH_4$ ratio decreased from 8:1 to 3.5:1, the etch rate of the ARL in 10:1 buffered oxide etchant HF (BOE-HF) (i.e., a BOE-HF having a ratio of buffering agent to hydrofluoric acid of 10:1) declined from 20000 Å/min to 3000 Å/min.

Figure 1:
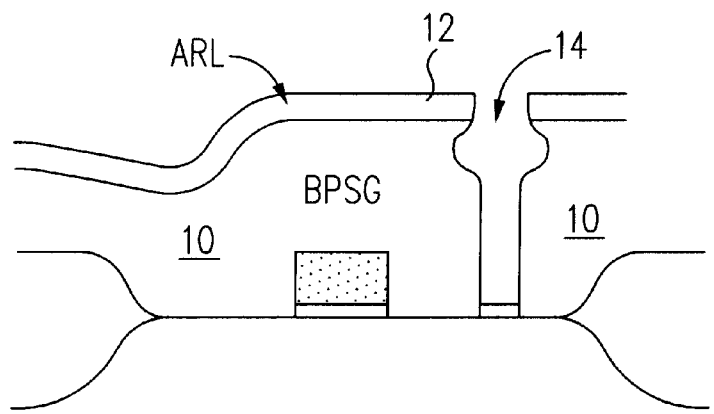
FIG. 1. is a cross-sectional view showing the overhang that can develop in the sides of a contact hole in the course of removing an ARL.
Figure 2:
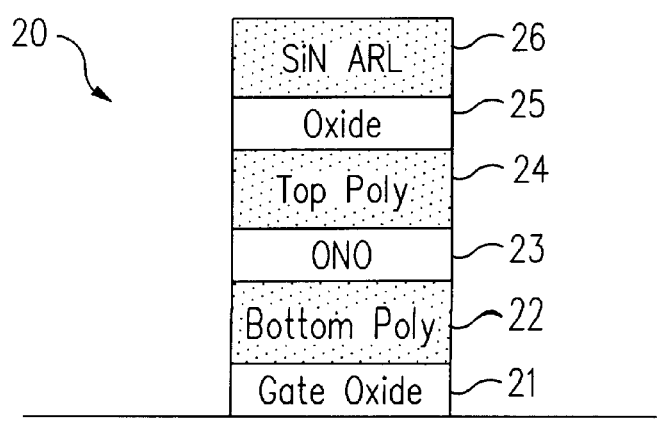
FIG. 2 is a cross-sectional view of a floating gate memory which shows how the oxide and ONO layers can become damaged in the removal of an ARL.
Figure 3:
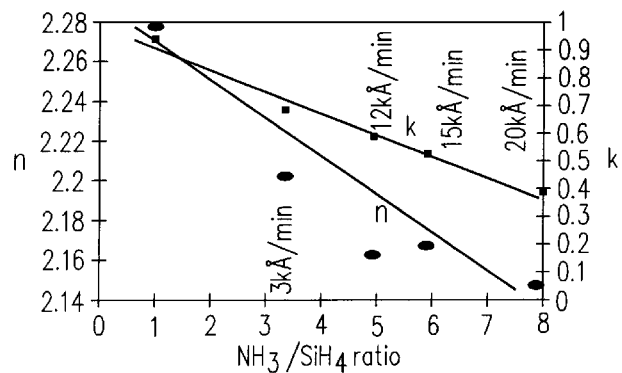
FIG. 3 is a graph showing the variation of the refractive index n and the extinction coefficient k of a silicon nitride ARL as a function of the ratio of $NH_3$ to $SiH_4$ at a constant temperature of 250° C.
Figure 4:
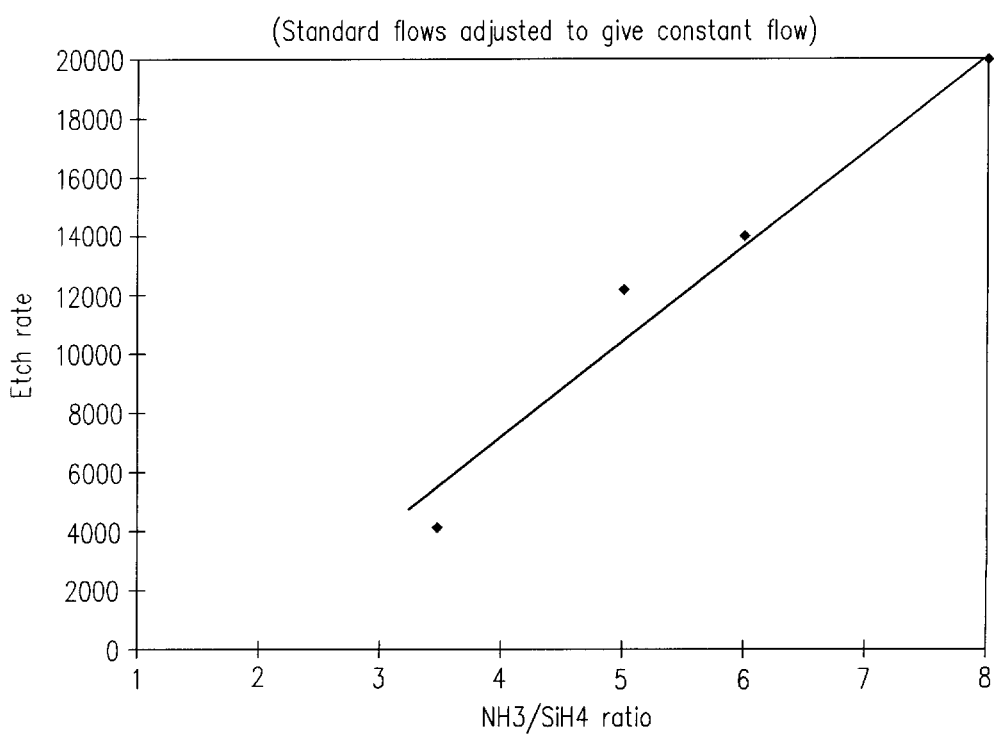
FIG. 4 is a graph showing the variation of the etch rate of a silicon nitride ARL as a function of the ratio of $NH_3$ to $SiH_4$ at a constant temperature of 250° C.

The process parameters and results of this series of experiments are shown in FIGS. 3 and 4 and in Table 1 below.

TABLE 1

| $NH_3:SiH_4$ ratio | 3.5:1 | 5:1 | 6:1 | 8:1 |
|---|---|---|---|---|
| $SiH_4$ (sccm) | 1000 | 750 | 642 | 500 |
| $NH_3$ (sccm) | 3500 | 3750 | 3858 | 4000 |
| $N_2$ (sccm) | 1500 | 1500 | 1500 | 1500 |
| RF power (W/cm$^2$) | 0.12 | 0.12 | 0.12 | 0.12 |
| Pressure (mTorr) | 2.6 | 2.6 | 2.6 | 2.6 |
| n | 2.1994 | 2.161 | 2.165 | 2.1482 |
| k | 0.6897 | 0.5837 | 0.5167 | 0.3912 |

While the lowest ratio of $NH_3$ to $SiH_4$ in Table 1 is 3.5:1, we believe that useful ARLs can be obtained at ratios down to 1:1.

Figures 5, 6:
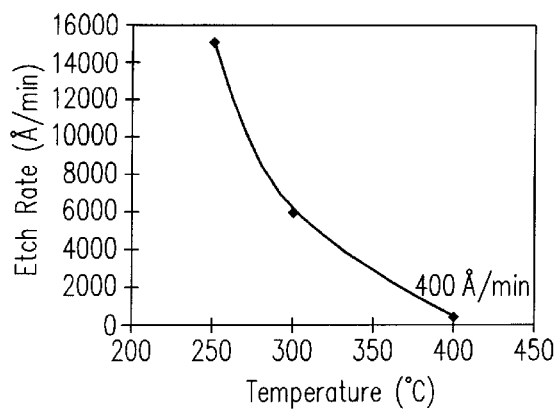
FIG. 5 is a graph showing the variation of the etch rate of a silicon nitride ARL with temperature at a constant $NH_3:SiH_4$ ratio of 6:1.
FIG. 6 is a chart which shows directionally the dependence of the properties of an silicon nitride ARL on various process parameters.

In another series of experiments the ratio of $NH_3$ to $SiH_4$ was held constant at 6:1, while the temperature was varied from 250° C. to 400° C. The etch rate of the ARL in 10:1 BOE HF decreased dramatically from 15000 Å/min to 400 Å/min. The results of these tests are shown in FIG. 5. By appropriately setting the $NH_3$ to $SiH_4$ ratio, the temperature can be reduced to the region of 100° C. or can be increased to the region of 450° C.

FIG. 6 shows directionally the dependence of the properties of an silicon nitride ARL on various process parameters. Among the relationships indicated are the drastic drop in n and k and the marked increase in etch rate with decreasing temperature, and a marked increase in n and k with a decreasing $NH_3$ to $SiH_4$ ratio.

A silicon nitride ARL formed at 250° C. and a $NH_3:SiH_4$ ratio of 6:1 was analysed in a Hydrogen Forward Scattering-Rutherford Back Scattering (HFS-RBS) test. The hydrogen content of the ARL ("y" in the formula $Si_{1-(x+y)}N_xH_y$) was found to be about 30%. This hydrogen content is substantially higher than the hydrogen content of a standard silicon nitride passivation layer (about 20%), and it correlates with the high etch rate of the ARL in BOE-HF. The increased hydrogen content apparently increases the etch rate due to relatively weakly bound hydrogen in the bulk of the solid. In some ARLs according to this invention the hydrogen content could be from 25% to 50%. The atomic percentages of the silicon, nitrogen and hydrogen in the silicon nitride will depend on the particular etchant used. Generally, we believe that in ARLs according to this invention the percentage of hydrogen will be in the range 3%–17% or 25%–50%, or the content of nitrogen will be in the range 20%–50% or 65%–75%.

For a typical deposition of 200 mm wafers at 250° C., using a $NH_3$ to $SiH_4$ ratio of 6:1, we obtained an ARL having the following properties:

| | |
|---|---|
| n | 2.16 |
| n uniformity (1σ) | 0.65% |
| k | 0.53 |
| k uniformity (1σ) | 1.47% |
| thickness | 300 Å |
| thickness uniformity (1σ) | 1% |
| edge exclusion | 3 mm |

I-line ARL

At a process temperature of 250° C., and using a gas mixture of $NH_3$ and $SiH_4$ in a 6:1 ratio along with $N_2$, we obtained an silicon nitride ARL with an n of only about 2.0 and a k of only about 0.09 at a radiation wavelength of 365 nm. This value of k is too low for most i-line applications.

By raising the process temperature to 400° C., however, we were able to adjust the gas flows to obtain an n @$\lambda$=365 nm in the range of 2.37–2.67 and a k @$\lambda$=365 in the range of 0.22–0.48. FIG. 7 contains a table which shows values of n and k ($\lambda$=365 nm) that were obtained at various flow rates and $NH_3$:$SiH_4$ ratios when the process temperature was maintained at 400° C.

Good selectivity with respect to oxide can be obtained if a nitride specific etchant like hot phosphoric acid ($H_3PO_4$ at 165° C.) is used. However, the choice of etchant varies from application to application and is dictated by the etch budget and the integration scenario involved. The invention described herein can easily be carried out with etchants other than hot phosphoric acid or BOE-HF.

It will be understood that the embodiments described above are merely illustrative of the broad principles of this invention, and not limiting. Many alternative and additional embodiments of this invention will be apparent to those skilled in the art.

We claim:

1. A method of patterning an underlying layer formed over a substrate comprising:

placing a substrate over which the underlying layer has been formed in a plasma-enhanced chemical vapor deposition unit having a reaction chamber;

introducing gaseous ammonia and silane into the reaction chamber at a temperature of from 100° C. to 450° C. and at a volumetric ratio of from 1:1 to 7:1 ($NH_3$:$SiH_4$) and in the presence of RF power in the range of 0.02 $W/cm^2$ to 1 $W/cm^2$ so as to form a silicon nitride antireflective layer on the underlying layer;

forming a photoresist layer on the antireflective layer;

exposing the photoresist layer to radiation;

developing the photoresist layer;

etching the photoresist layer to form at least one aperture in the photoresist layer, thereby exposing a portion of the antireflective layer;

etching the exposed portion of the antireflective layer;

etching a portion of the underlying layer through the at least one aperture in the photoresist layer;

removing the remainder of the photoresist layer; and removing the remainder of the antireflective layer.

2. The method of claim 1 wherein exposing the photoresist layer to radiation comprises exposing the photoresist layer to radiation having a wavelength of 248 nm.

3. The method of claim 2 wherein removing the remainder of the antireflective layer comprises etching the remainder of the antireflective layer using buffered oxide etchant HF.

4. The method of claim 1 wherein exposing the photoresist layer to radiation comprises exposing the photoresist layer to radiation having a wavelength of 365 nm.

5. The method of claim 4 wherein removing the remainder of the antireflective layer comprises etching the remainder of the antireflective layer using phosphoric acid.

6. The method of claim 1 wherein exposing the photoresist layer to radiation comprises exposing the photoresist layer to radiation having a wavelength of 191 nm.

7. The method of claim 1 wherein removing the remainder of the antireflective layer comprises etching the remainder of the antireflective layer at a rate of from 3000 Å/min to 20000 Å/min.

8. The method of claim 1 wherein introducing gaseous ammonia and silane into the reaction chamber is performed at a volumetric ratio of 6:1 to 7:1 ($NH_3$:$SiH_4$).

9. The method of claim 8 wherein exposing the photoresist layer to radiation comprises exposing the photoresist layer to radiation having a wavelength of 193 mn.

10. The method of claim 9 wherein introducing gaseous ammonia and silane into the reaction chamber is performed at a temperature of about 200° C.

11. The method of claim 8 wherein exposing the photoresist layer to radiation comprises exposing the photoresist layer to radiation having a wavelength of 248 nm.

12. The method of claim 11 wherein introducing gaseous ammonia and silane into the reaction chamber is performed at a temperature of about 250° C.

* * * * *